United States Patent
Gonzalez et al.

(10) Patent No.: US 7,445,973 B2
(45) Date of Patent: Nov. 4, 2008

(54) TRANSISTOR SURROUND GATE STRUCTURE WITH SILICON-ON-INSULATOR ISOLATION FOR MEMORY CELLS, MEMORY ARRAYS, MEMORY DEVICES AND SYSTEMS AND METHODS OF FORMING SAME

(75) Inventors: Fernando Gonzalez, Boise, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 42 days.

(21) Appl. No.: 11/541,186

(22) Filed: Sep. 29, 2006

(65) Prior Publication Data

US 2008/0079053 A1    Apr. 3, 2008

(51) Int. Cl.
*H01L 21/00* (2006.01)

(52) U.S. Cl. .................. 438/158; 438/426; 438/198

(58) Field of Classification Search .......... 438/158, 438/198, 426
See application file for complete search history.

(56) References Cited

U.S. PATENT DOCUMENTS

| | | | |
|---|---|---|---|
| 5,448,513 A | 9/1995 | Hu et al. | 365/150 |
| 5,963,789 A | 10/1999 | Tsuchiaki | |
| 6,232,202 B1 | 5/2001 | Hong | |
| 6,551,937 B2 * | 4/2003 | Jun et al. | 438/694 |
| 6,784,076 B2 * | 8/2004 | Gonzalez et al. | 438/426 |
| 7,045,407 B2 * | 5/2006 | Keating et al. | 438/198 |
| 7,060,579 B2 * | 6/2006 | Chidambaram et al. | 438/303 |
| 7,301,207 B2 * | 11/2007 | Kim et al. | 257/374 |
| 7,332,790 B2 * | 2/2008 | Gonzalez et al. | 257/513 |
| 2003/0040185 A1 * | 2/2003 | Jun et al. | 438/695 |
| 2003/0075730 A1 | 4/2003 | Jang | |
| 2003/0190766 A1 | 10/2003 | Gonzalez et al. | |
| 2004/0110383 A1 | 6/2004 | Tanaka | |
| 2004/0238889 A1 * | 12/2004 | Gonzalez et al. | 257/347 |
| 2004/0259360 A1 | 12/2004 | Jung | |
| 2005/0224880 A1 | 10/2005 | Lee et al. | |
| 2006/0006442 A1 * | 1/2006 | Gonzalez et al. | 257/296 |
| 2006/0131666 A1 | 6/2006 | Li et al. | |
| 2006/0292766 A1 * | 12/2006 | Gonzalez et al. | 438/158 |
| 2006/0292767 A1 * | 12/2006 | Gonzalez et al. | 438/158 |
| 2008/0044994 A1 * | 2/2008 | Kim et al. | 438/595 |
| 2008/0079053 A1 * | 4/2008 | Gonzalez et al. | 257/314 |

FOREIGN PATENT DOCUMENTS

| | | |
|---|---|---|
| EP | 1191596 A2 | 3/2002 |
| JP | 60072243 A | 4/1985 |

OTHER PUBLICATIONS

U.S. Appl. No. 11/488,384, filed Jul. 17, 2006, Gonzalez, Fernando.

* cited by examiner

*Primary Examiner*—Laura M Menz

(57) ABSTRACT

A transistor surround gate structure and a method of forming thereof on a semiconductor assembly are described. The transistor surround gate structure is formed on a partial silicon-on-insulator in one direction and on a full silicon-on insulator in a second direction and may be scaled to $4f^2$ line width for a memory array. A plurality of transistor surround gate structures are utilized as memory storage cells in various memory device applications, such as a dynamic random access memory application, a flash memory application and a single transistor memory cell is utilized in an embedded memory device application, which provide for the use of any one of the memory device applications to be used in a system.

5 Claims, 12 Drawing Sheets

US 7,445,973 B2

TRANSISTOR SURROUND GATE STRUCTURE WITH SILICON-ON-INSULATOR ISOLATION FOR MEMORY CELLS, MEMORY ARRAYS, MEMORY DEVICES AND SYSTEMS AND METHODS OF FORMING SAME

FIELD OF THE INVENTION

Embodiments of the invention relate to semiconductor structures and fabrication processes to form semiconductor devices. Embodiments of the invention particularly relate to transistor surround gate structures and methods to fabricate the transistor surround gate structures using a partial and full silicon-on-insulator fabrication methods for manufacturing semiconductor devices.

BACKGROUND OF THE INVENTION

In semiconductor memory devices, such as a Dynamic Random Access Memory (DRAM) device, the memory cell is typically made up of two main components, a field effect transistor (FET) and a storage capacitor. The FET is typically a standard transistor structure having a gate electrode overlying a channel region with the channel region spanning between the source and drain electrode. In order to obtain smaller memory cell scaling, the vertical sidewall gated transistor structure in conjunction with the storage capacitor has evolved.

The DRAM memory cell was also fabricated using semiconductor-on-insulator or silicon-on-insulator (SOI) substrates to help reduce soft errors and improve refresh times that the typical DRAM substrate may be prone to. SOI substrates typically comprise a thin layer of active semiconductor, such as silicon, on an underlying insulating layer, such as silicon dioxide ($SiO_2$) and the SOI fabrication technology is well known to one skilled in the art and is often referred to as silicon-on-insulator.

U.S. Pat. No. 5,448,513 discloses a capacitorless DRAM fabricated on a silicon-on-insulator (SOI) substrate. Some of the advantages gained by forming a capacitorless DRAM and utilizing an SOI substrate include reducing soft-error rate that are inherent in "gain cell" memory devices, a less complex fabrication process and a smaller memory cell that allows dense memory scaling. However, current lithographic capabilities provide new challenges to fabricate DRAM memory cells that are scalable to the minimum lithographic line feature.

What is needed is a transistor structure that is scalable to a minimum lithographic feature size for use in semiconductor memory devices, such as for a capacitorless DRAM device, a Flash memory device or an embedded memory device.

DETAILED DESCRIPTION OF THE INVENTION

In the following description, the terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but could be based on silicon-germanium, silicon-on-insulator, silicon-on-saphire, germanium, or gallium arsenide, among others.

The present invention, described hereinafter in various embodiments includes a transistor surround gate structure that is fabricated laterally on a semiconductor based substrate. The transistor surround gate structure may be used as a nonvolatile memory storage cell for a single storage cell or an array of storage cells for a given device, such as for embedded memory devices, DRAM devices, flash memory devices, or other devices that use memory cells. A memory cell having a transistor surround gate structure of the various embodiments of the present invention does not require a capacitor for storage and relies on the transistor structure for retaining data.

Utilizing the transistor surround gate structure of several embodiments of the present invention as described hereinafter allows for a reduced feature size of a storage cell to allowing minimal scaling of the storage cell in a memory array. The following embodiments will demonstrate various applications of the transistor surround gate structure of the present invention.

Figure 1:
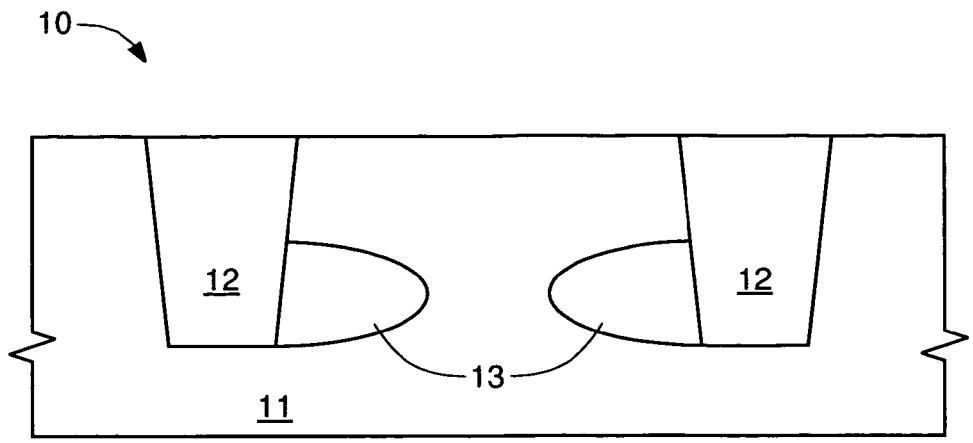
FIG. 1 depicts a semiconductor fabrication method to form shallow trench isolation on a semiconductor substrate section using a partial silicon-on-insulator fabrication techniques prior to formation of a transistor surround gate structure of an embodiment of the present invention.

FIG. 1 depicts a semiconductor fabrication method to form shallow trench isolation on a semiconductor substrate section using a partial silicon-on-insulator fabrication technique prior to formation of a transistor surround gate structure utilized in the various embodiments of the present invention. U.S. Pat. No. 6,784,076, issued Aug. 31, 2004, and hereby incorporated by reference as if set forth in its entirety, teaches a partial silicon-on insulator fabrication technique that may be used to fabricate a semiconductor substrate section to the point as depicted in FIG. 1.

Referring to FIG. 1, semiconductor substrate section 10 comprises silicon substrate 11 into which trench isolation regions 12 and partial silicon-on-isolator isolation regions 13 are formed. Trench isolation regions 12 and partial silicon-on-isolator isolation regions 13 comprise an insulative material, preferably an oxide that will provide etching selectivity to silicon so that the neighboring silicon material can be etched selective to the insulative material.

Figure 2:
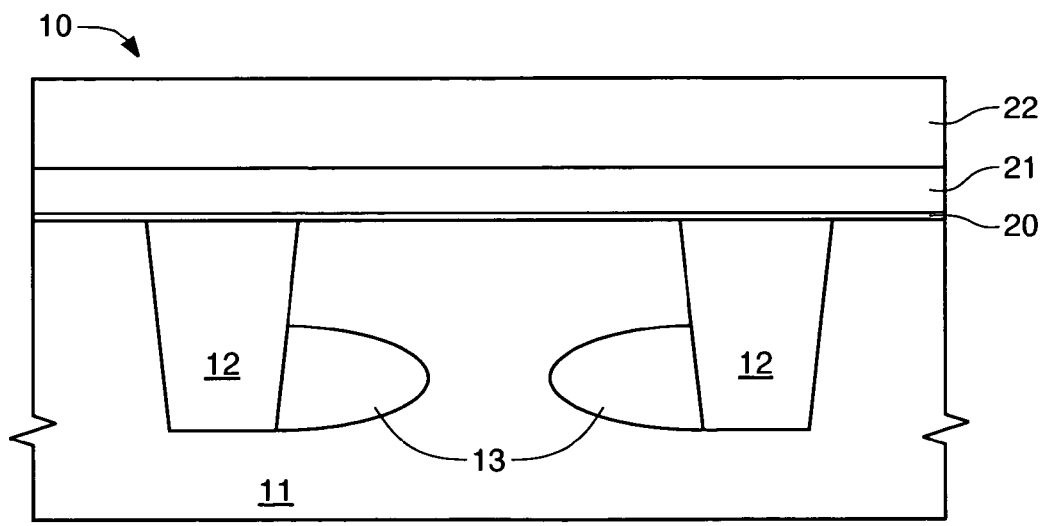
FIG. 2 is a subsequent cross-sectional view of the semiconductor substrate section taken from FIG. 1 following the deposition of nitride and photoresist layers on the semiconductor substrate section to pattern an active area bridge.
Figure 8:
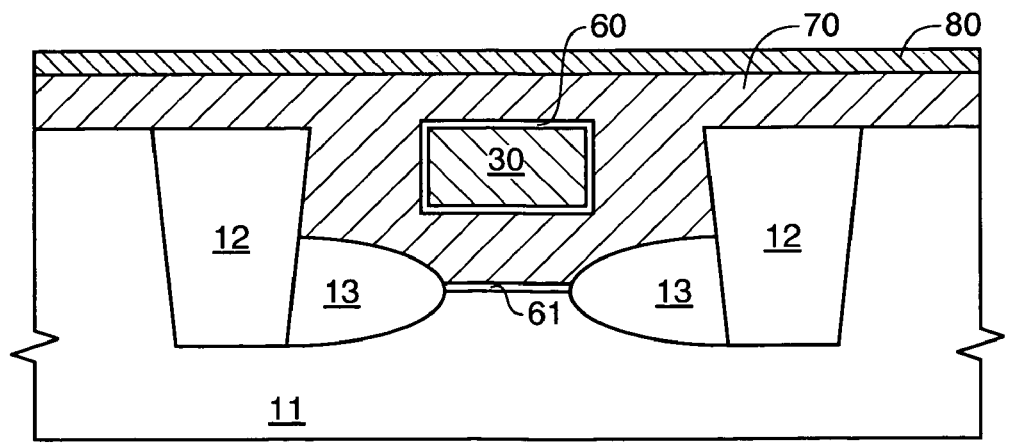
FIG. 8 is a subsequent cross-sectional view taken from FIG. 7 following a formation of polycide layer of material on the planarized polysilicon fill material to complete the formation of the transistor surround gate structure.

Starting with FIG. 2 and continuing through FIG. 8, a first embodiment of the present invention builds on the partial silicon-on-insulator fabrication, as depicted in FIG. 1, to construct a single transistor storage cell that relies on its own capacitance to store a charge that would be useful in memory devices and particularly in embedded memory devices. Referring now to FIG. 2, pad oxide 20, nitride layer 21 and photoresist layer 22 are deposited on the exposed surfaces of silicon substrate 11 and trench isolation regions 12.

Figure 3:
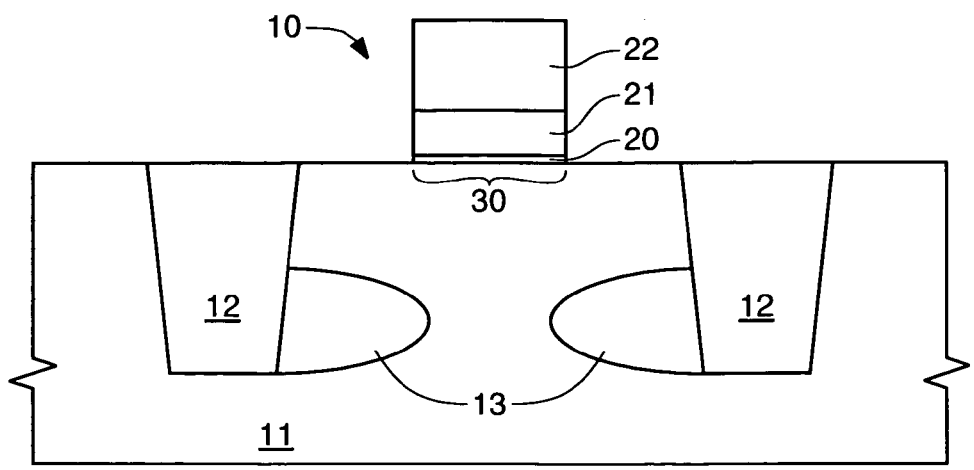
FIG. 3 is a subsequent cross-sectional view taken from FIG. 2 following the patterning of a hard mask of nitride (after the photoresist is removed) to define an underlying active area bridge in a silicon substrate.

Referring now to FIG. 3, pad oxide 20, nitride layer 21 and photoresist layer 22 are patterned and etched to define an underlying active area, or silicon bridge 30, in silicon substrate 11.

Figure 4:
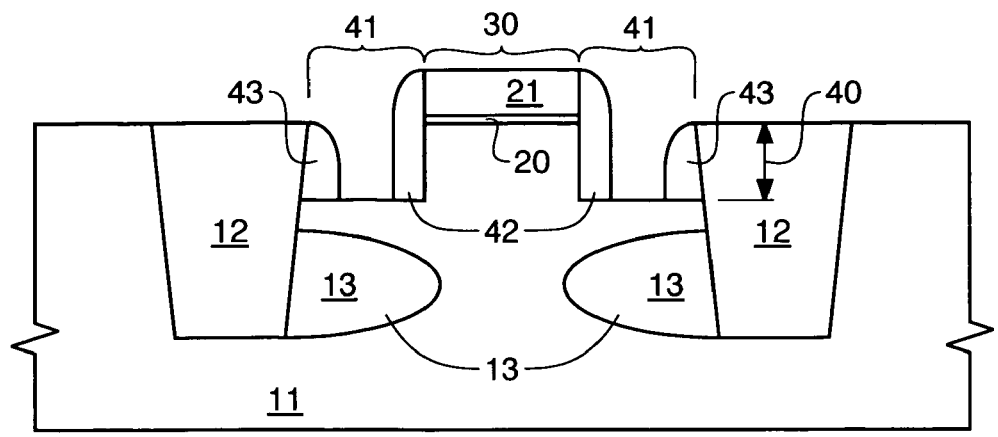
FIG. 4 is a subsequent cross-sectional view taken from FIG. 3 after the deposition of a thin nitride layer on the semiconductor substrate section, followed by a nitride spacer etch, to form substantially thin vertical nitride spacers along a silicon portion defining the transistor channel, and along the trench isolation region.

Referring now to FIG. 4, a dry etch selective to silicon is performed that creates cavities into the silicon substrate 11 at a desired trench depth 40 to create silicon trenches 41. An example of a suitable dry etch would be an anisotropic etch such as, $C_2F_6$, $SF_6$, HBr and $CF_4$ chemistries typically used in an industry standard shallow trench isolation etch. The patterned nitride hard mask 20 is used to protect the underlying silicon substrate 11 and to define a subsequently formed transistor channel. Following the dry etch, a nitride layer is deposited on the silicon substrate 11, into silicon trenches 41 and on the exposed surfaces of trench isolation regions 12. Next, a nitride spacer etch, such as a using a standard hard mask etch that is selective to oxide (thus the etch stops on oxide), is performed to form substantially vertical nitride spacers 42 along the silicon bridge 30 (the silicon portion defining the transistor channel) and to form substantially vertical nitride spacers 43 along exposed edges of trench isolation 12.

Figure 5:
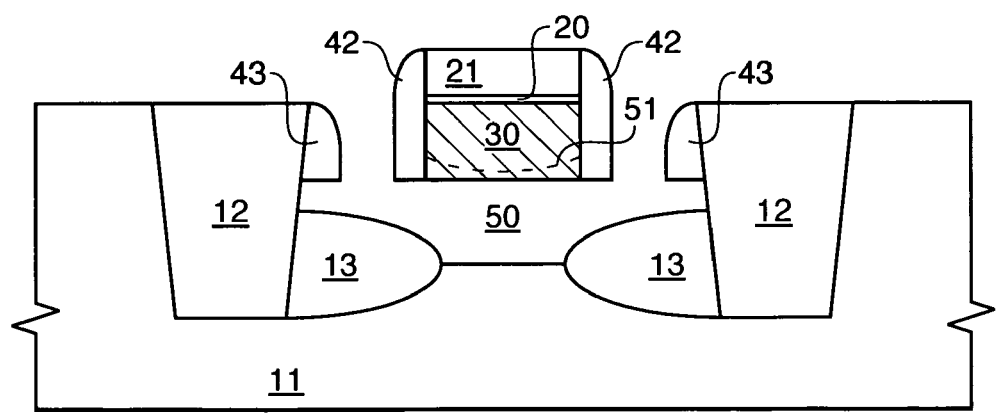
FIG. 5 is a subsequent cross-sectional view taken from FIG. 4 following an isotropic etch that is selective to oxide, such as a TMAH etch, to create a cavity around and beneath the silicon bridge while leaving the silicon bridge intact.

Referring now to FIG. 5, an isotropic etch that is selective to oxide, such as a tetramethyl ammonium hydroxide (TMAH) etch, is performed to create a cavity 50 around and beneath silicon bridge 30, while leaving the majority of silicon bridge 30 intact which will subsequently be fashioned to serve as the transistor channel. The depth can be optimized to increase the vertical sides of the channel. The etch may actually undercut silicon bridge 30 in a fashion as represented by dashed line 51. Regardless if the silicon is under cut, the remaining silicon bridge 30 retains a substantial thickness needed for transistor channel operation. It is desired that the isotropic etch stops at a point where the surface of the etched silicon substrate spanning between the partial silicon-on-insulator regions is recessed to no more than one-half the depth of the partial silicon-on-insulator regions. Partial silicon-on-isolator isolation regions 13 run parallel with the transistor channel or silicon bridge 30. It is also desirable that a distance "d" is kept at a minimum and with the main requirement being that silicon bridge 30 is separated from underlying silicon substrate 11, as is evident in FIG. 6.

Figure 6:
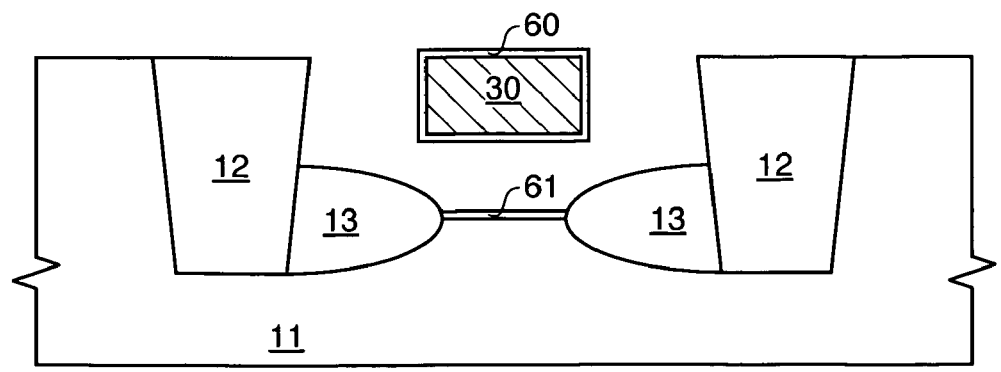
FIG. 6 is a subsequent cross-sectional view taken from FIG. 5 following a wet etch to remove the nitride hard mask and nitride spacers, followed by a deposition of a transistor gate oxide around the exposed regions of the transistor channel silicon portion.

Referring now to FIG. 6, a wet etch, such as a phosphoric acid etch at 50-200 C, is performed to remove nitride hard mask 20 and nitride spacers 42 and 43 (all seen in FIG. 5). As seen in the cross-sectional view of FIG. 6, silicon bridge 30 appears to be suspended, however each end of silicon bridge 30 remains supported as they remain connected to the outerlying silicon substrate 11 (not seen) that is not being patterned. Next, an oxidation step is performed to form transistor gate oxide 60 around exposed regions of silicon bridge 30 and to form oxide barrier 61 spanning between partial silicon-on-insulator insulation regions 13.

Figure 7:
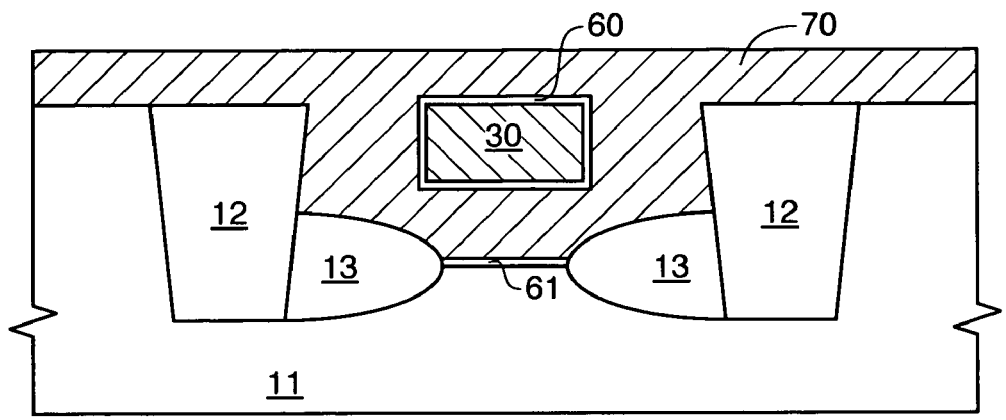
FIG. 7 is a subsequent cross-sectional view taken from FIG. 6 following a deposition of a polysilicon fill material, such as an insitu doped amorphous polysilicon, followed by planarization of the polysilicon fill material.

Referring now to FIG. 7, an amorphous silicon or polysilicon deposition step is performed, such as by using $SiH_4$ under 500-700 C while being insitu doped with phosphorus, to form polysilicon fill material 70, (i.e., an insitu doped amorphous polysilicon), that fills cavity 50 and covers exposed trench isolation regions 12 and the exposed surface of silicon substrate 11. Next, a planarization step of the polysilicon fill material 70 is performed.

Referring now to FIG. 8, a polycide layer, such a tungsten silicide (WSi$_x$) is formed, such as by Pressure Vapor Deposition (PVD) or Chemical Vapor Deposition (CVD) techniques, on the planarized polysilicon fill material 70 to complete formation of a transistor surround gate structure of the first embodiment of the present invention. The transistor surround gate structure comprises silicon bridge 30 covered with transistor gate oxide 60 and surrounded by patterned polysilicon 70 that serves as the surround gate to transistor. The silicon bridge 30 will serve as a transistor channel region for the transistor surround gate structure and the opposing ends of silicon bridge 30 will serve as source/drain electrodes. Contact to the source/drain electrodes may be made by patterning techniques known to one skilled in the art that will complete connection to the transistor surround gate structure.

A second embodiment is depicted in FIG. 9-FIG. 17 that utilizes a similar transistor surround gate structure with some fabrication and structural adjustments in order to make an array of single transistor surround gate storage devices, wherein each single transistor surround gate storage device has the structural ability to store a charge.

Figure 9:
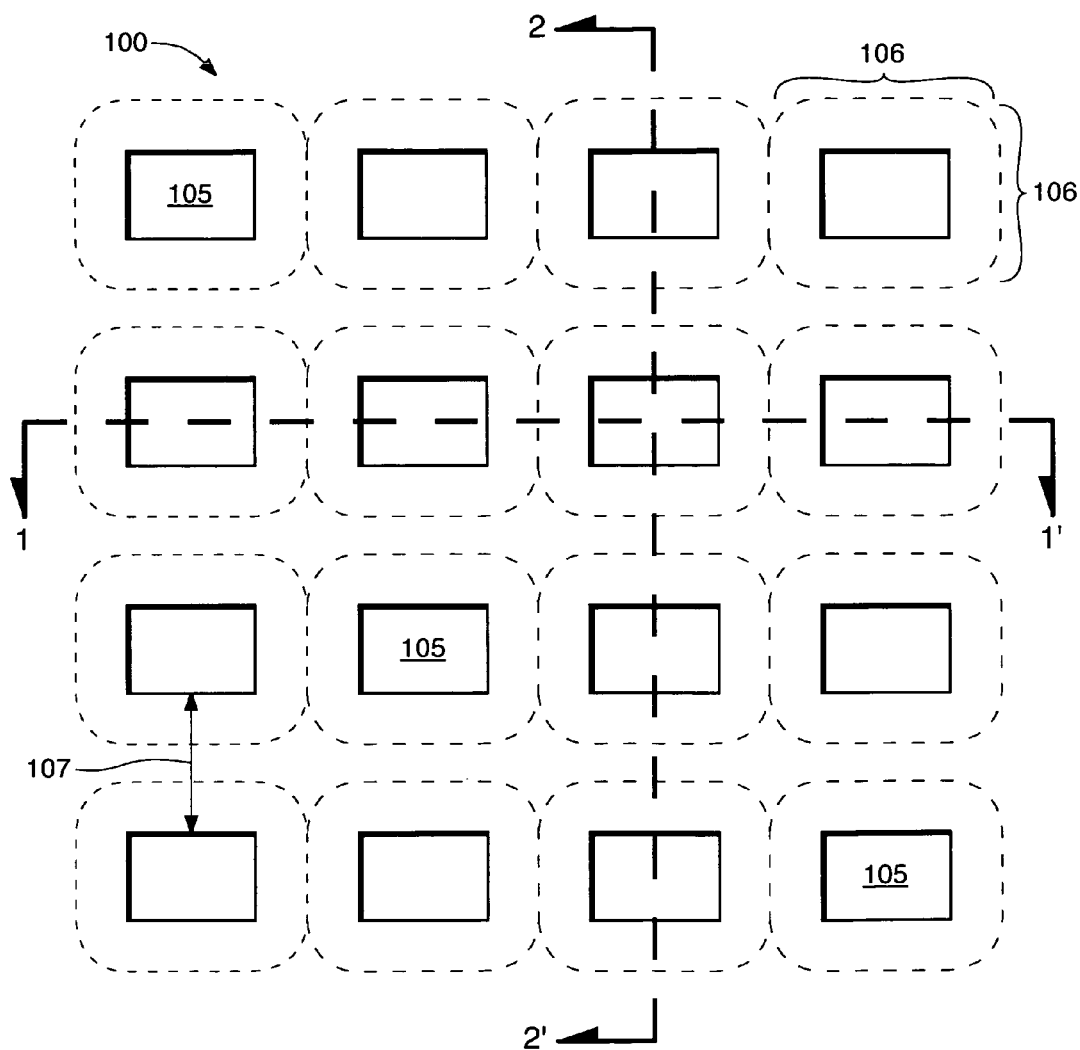
FIG. 9 is an overhead view of a memory array section with active area pattern, scaled to a $4f^2$ memory cell size, utilizing a transistor surround gate structure of a second embodiment of the present invention.

FIG. 9 depicts a simplified overhead view of layout of isolation area openings 105 and undercut areas 106 to be fabricated in a silicon substrate 100 as taught in the following process steps of FIG. 10-FIG. 17. The distance 107 between adjacent isolation area openings 105 is variable to allow for the formation of additional transistor surround gate structures therebetween, which is further discussed as illustrated in FIG. 17. A uniqueness of the surround gate structures is the formation of a partial-silicon-on-insulator isolation in one direction (the y-axis of FIG. 9) and the formation of a full silicon-on-insulator isolation in a second direction (the x-axis of FIG. 9).

Figure 10:
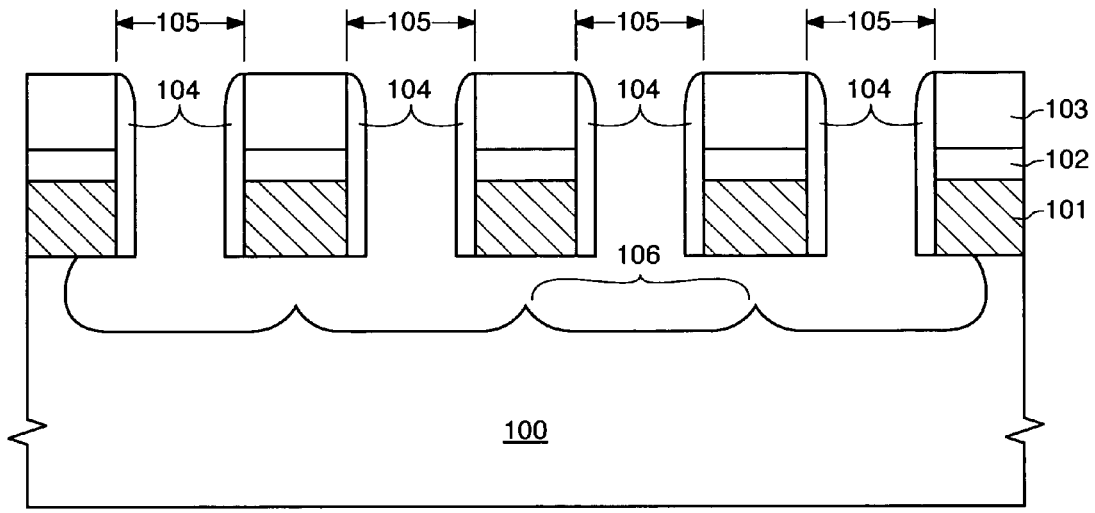
FIG. 10 is a cross-sectional view taken in the x-direction through cross-section line 1-1' of FIG. 9, depicting a plurality of active area islands undercut to provide isolation fill areas for the partial silicon-on-insulator in preparation for transistors having the transistor surround gate structures of the second embodiment of the present invention.
Figure 11:
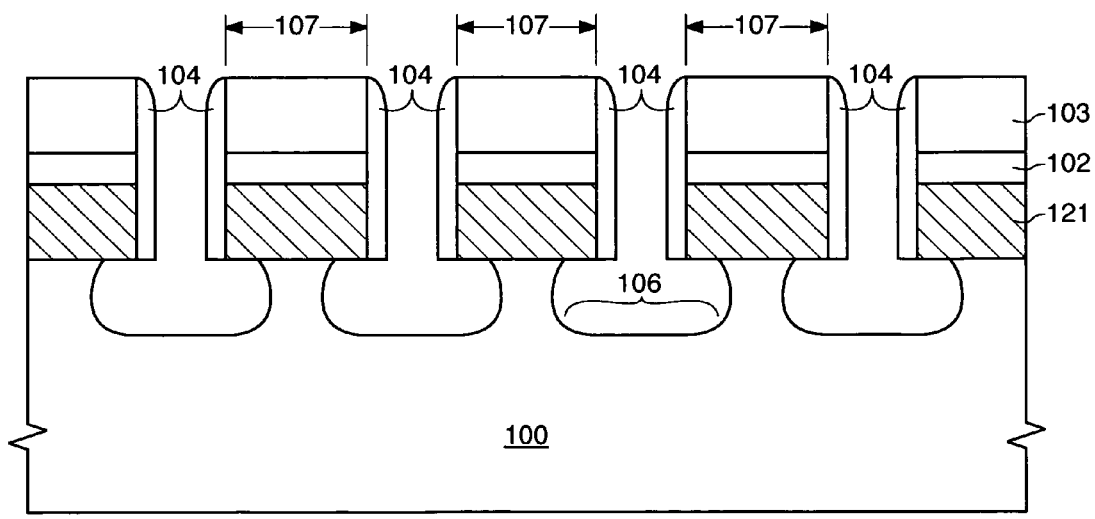
FIG. 11 is a cross-sectional view taken in the y-direction through cross-section line 2-2' of FIG. 9 depicting a plurality of active area bridges supported by a single crystal silicon bridge left intact for transistor surround gate structures of the second embodiment of the present invention.

FIG. 10 is a cross-sectional view taken through line 1-1' (the x axis) of FIG. 9, while FIG. 11 is a cross-sectional view taken through line 2-2' (the y axis) of FIG. 9. Referring now to FIG. 10 silicon active area islands 101 are created into silicon substrate 100 by performing a silicon etch using patterned blocks of oxide 102 and nitride 103. Next nitride spacers 104 are formed on the exposed vertical edges of silicon active area islands 101 and oxide 102 and nitride 103. The presence of nitride (nitride spacers 104 and nitride 103) allows for a subsequent anisotropic etch, such as an etch using C$_2$F$_6$, SF$_6$, HBr and CF$_4$ chemistries, and a following isotropic etch, such as TMAH, to first clear the exposed silicon substrate 100 in isolation area openings 105 and continue to etch (undercut) the silicon substrate 100 to create undercut openings 106. As seen in the x-direction cross-sectional view of FIG. 10, silicon active area islands 101 appear to be suspended, however each end of silicon active are islands 101 remain supported as they remain connected to the outer-lying silicon substrate (not seen) that is not being patterned.

Referring now to the y-direction cross-sectional view of FIG. 11, a portion of silicon substrate 100 remains after the etching sequence to support silicon active area bridges 121. Active area bridges 121 will be where the surround gate transistor structure will be built.

Figure 12:
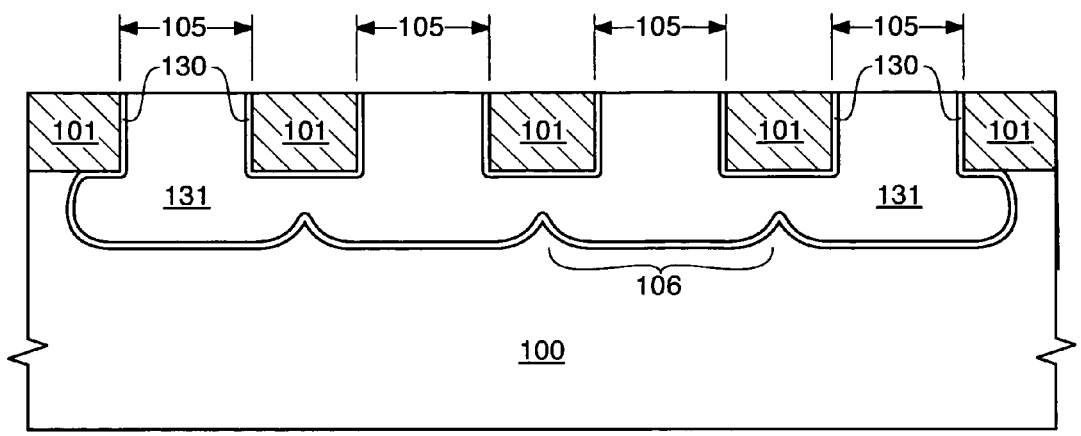
FIG. 12 and FIG. 13 are cross-sectional views taken view taken from FIGS. 10 and 11, respectively, following the lining of the isolation fill areas with nitride and the filling thereof with oxide.
Figure 13:
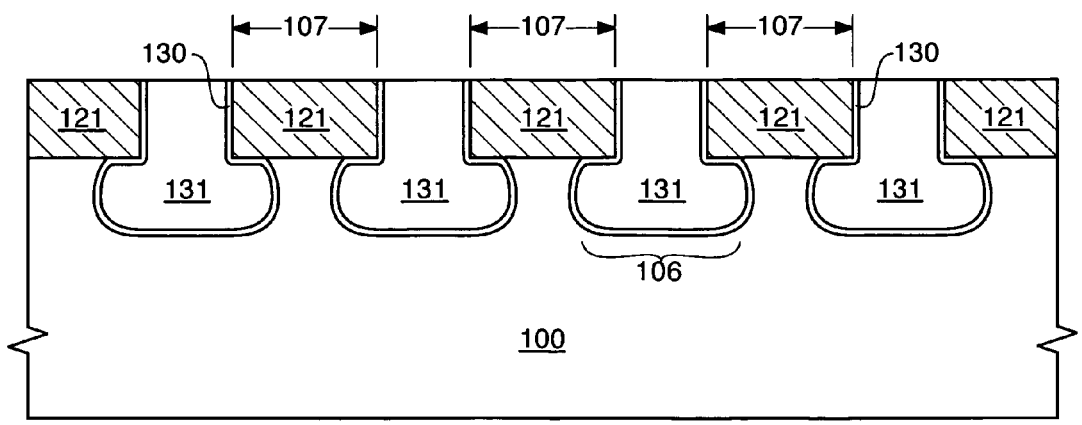

The x-direction cross-sectional view of FIG. 12 and y-direction cross-sectional view of FIG. 13, correspond with FIG. 10 and FIG. 11, respectively. Referring now to FIG. 12, the patterned blocks of oxide 102 and nitride 103 and the nitride spacers 104 (seen in FIG. 10) are removed and an oxide layer 130 is formed along the exposed edges of silicon substrate 100 and silicon active area islands 101. Next, an isolation material 131 fills the isolation undercut areas 106 and the isolation openings 105. Isolation material 131 forms a full-silicon-on-isolator isolation regions running perpendicular to a transistor channel region formed later on. Isolation material 131 also forms a partial silicon-on-insulator isolation running parallel with the subsequently formed transistor channel region. The isolation material 131 is then planarized back to the surface of silicon active area islands 101, using planarization techniques know to one skilled in the art.

Referring now to y-direction cross-sectional view of FIG. 13, as in FIG. 12, the patterned blocks of oxide 102 and nitride 103 and the nitride spacers 104 are removed and an oxide layer 130 is formed along the exposed edges of silicon substrate 100 and silicon active area bridges 121. Next, an isolation material 131 fills the isolation undercut areas 106 and the isolation openings 105. The isolation material 131 is then planarized back to the surface of silicon active area bridges 121, using planarization techniques know to one skilled in the art.

Figure 14:
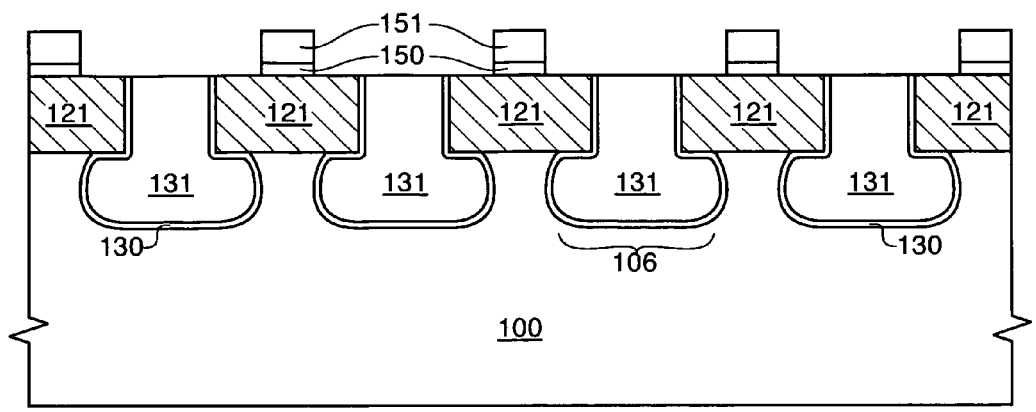
FIG. 14 is a cross-sectional view taken view taken from FIG. 13 following the patterning of a plurality transistor surround gate structures.

The y-direction cross-sectional view of FIG. 14, corresponds with FIG. 13, and provides a picture of following process steps. Referring now to FIG. 14, blocks are made of oxide 150 and nitride 151 which are patterned to define a silicon channel bridge that will be subsequently formed into silicon active area bridges 121.

Figure 15:
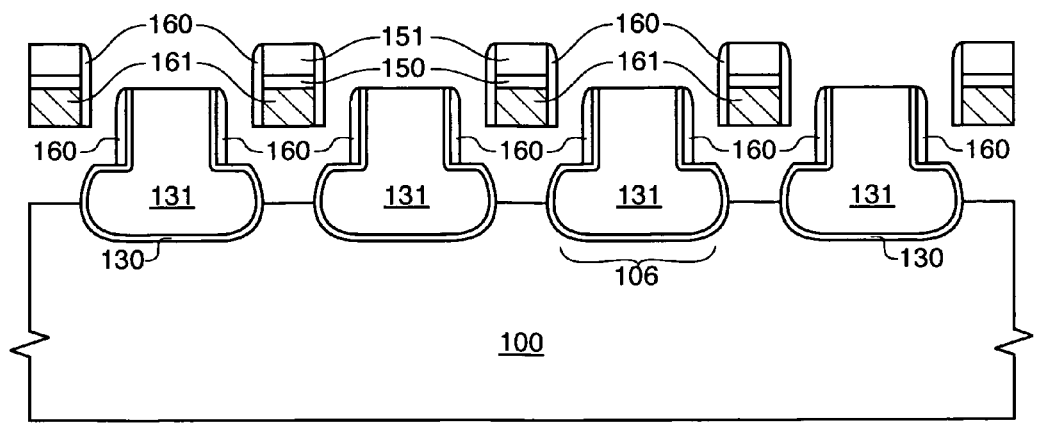
FIG. 15 is a cross-sectional view taken view taken from FIG. 14 after an etch is performed to form the transistor surround gate structures followed by the formation of vertical nitride spacers.

Referring now to y-direction cross-sectional view of FIG. 15, silicon bridges 161 are created into silicon active area bridges 121 by performing a silicon etch, such as C$_2$F$_6$, SF$_6$, HBr and CF$_4$ chemistries, using patterned blocks of oxide 150 and nitride 151. Next nitride spacers 160 are formed on the exposed vertical edges of silicon bridges 161, oxide 150 and nitride 151. The presence of nitride (nitride spacers 160 and nitride 151) allows for a subsequent etch, such as TMAH to clear and separate any silicon active bridge 121 that underlies silicon bridge 161 from silicon substrate 100, thus creating a recessed lateral plane in silicon substrate 100 that extends between adjacent isolation regions 131 and oxide liner 131. As seen in the y-direction cross-sectional view of FIG. 15, silicon active area bridges 121 appear to be suspended, however each end of silicon active are bridges 121 remain supported as they remain connected to the outer-lying silicon substrate (not seen) that is not being patterned.

Figure 16:
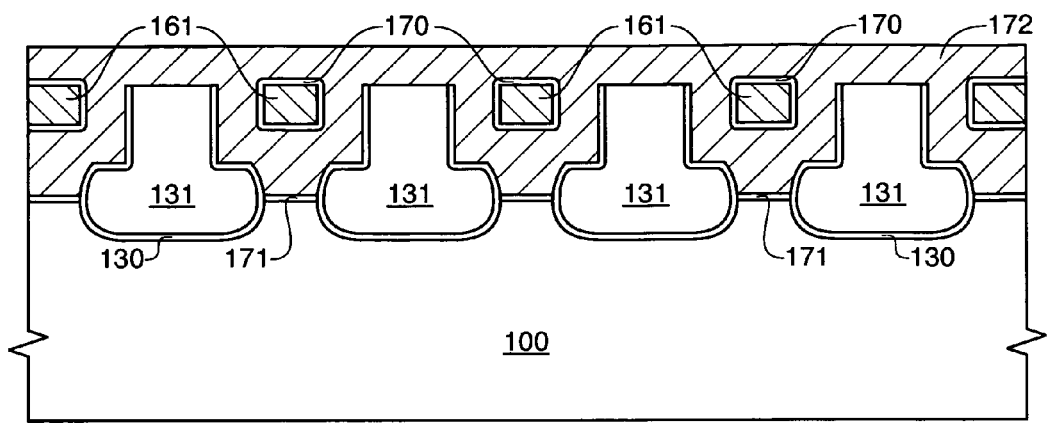
FIG. 16 is a cross-sectional view taken view taken from FIG. 15 after the forming a gate oxide about each transistor surround gate structure and an oxide barrier to the substrate, a polysilicon fill that engulfs each transistor surround gate structure and the oxide barrier that separating the polysilicon fill from the silicon substrate.
Figure 17:
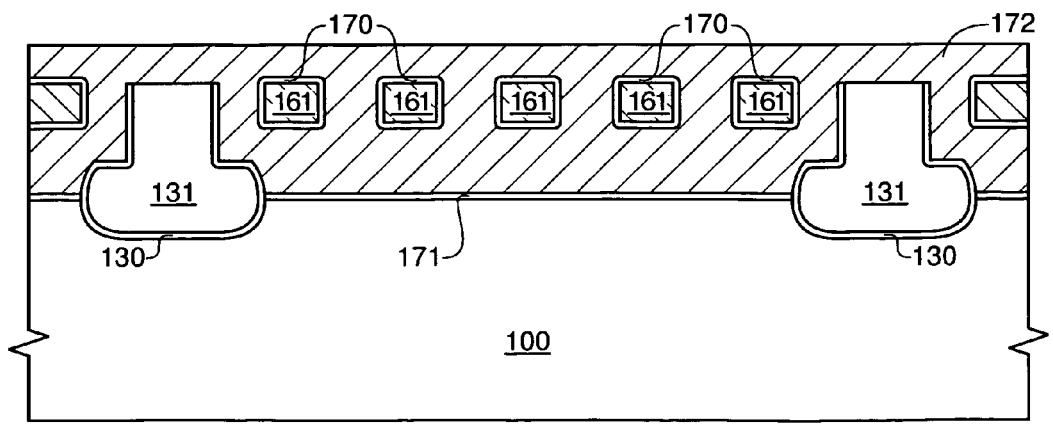
FIG. 17 is a cross-sectional view taken view taken in the y-direction following the process steps through FIG. 16 showing a plurality of transistor surround gate structures lined with transistor gate oxide and then engulfed by a planarized polysilicon fill that is separated from the silicon substrate with the oxide barrier.

Referring now to y-direction cross-sectional view of FIG. 16, nitride spacers 160, oxide 150 and nitride 151 are removed and an oxide is formed that surrounds and covers silicon bridge 161 that will serve as a gate oxide 170 to the transistor surround gate structure. The oxide also forms on the recessed lateral plane in silicon substrate 100 to serve as an oxide barrier 171 between silicon substrate 100 and a subsequently formed polysilicon material. With gate oxide 170 and oxide barrier 171 in place a polysilicon material is deposited using deposition techniques know to one skilled in the art, to fill and thus surround silicon bridges 161. The polysilicon material is planarized by techniques known to one skilled in the art to form the surround gate 172 of the transistor surround gate structure. The final transistor surround gate structure is made up of silicon bridges 161, which serve as a channel region including source and drain electrodes on opposing ends of the channel region, gate oxide 170 that surrounds silicon bridge 161 which is covered by surround gate 172. Conductive doping for the transistor surround gate structure is provided by doping techniques known to one skilled in the art, such as insitu doping during deposition of the polysilicon material. Contact to the source/drain electrodes may be made by patterning techniques know to one skilled in the art that will complete connection to the transistor surround gate structures depending on the desired use.

Referring now to y-direction cross-sectional view of FIG. 17, a plurality of transistor surround gate structures is shown. This example show that the variable distance 107, seen in overhead view of FIG. 9, may be expanded to incorporate a plurality of silicon bridges 161 between adjacent isolation regions 131, each being encompassed by surround gate 172. The silicon bridges may serve as access transistor channels, while the surround gate 172 may serve as a word line in a memory array of an integrated circuit.

Figure 18:
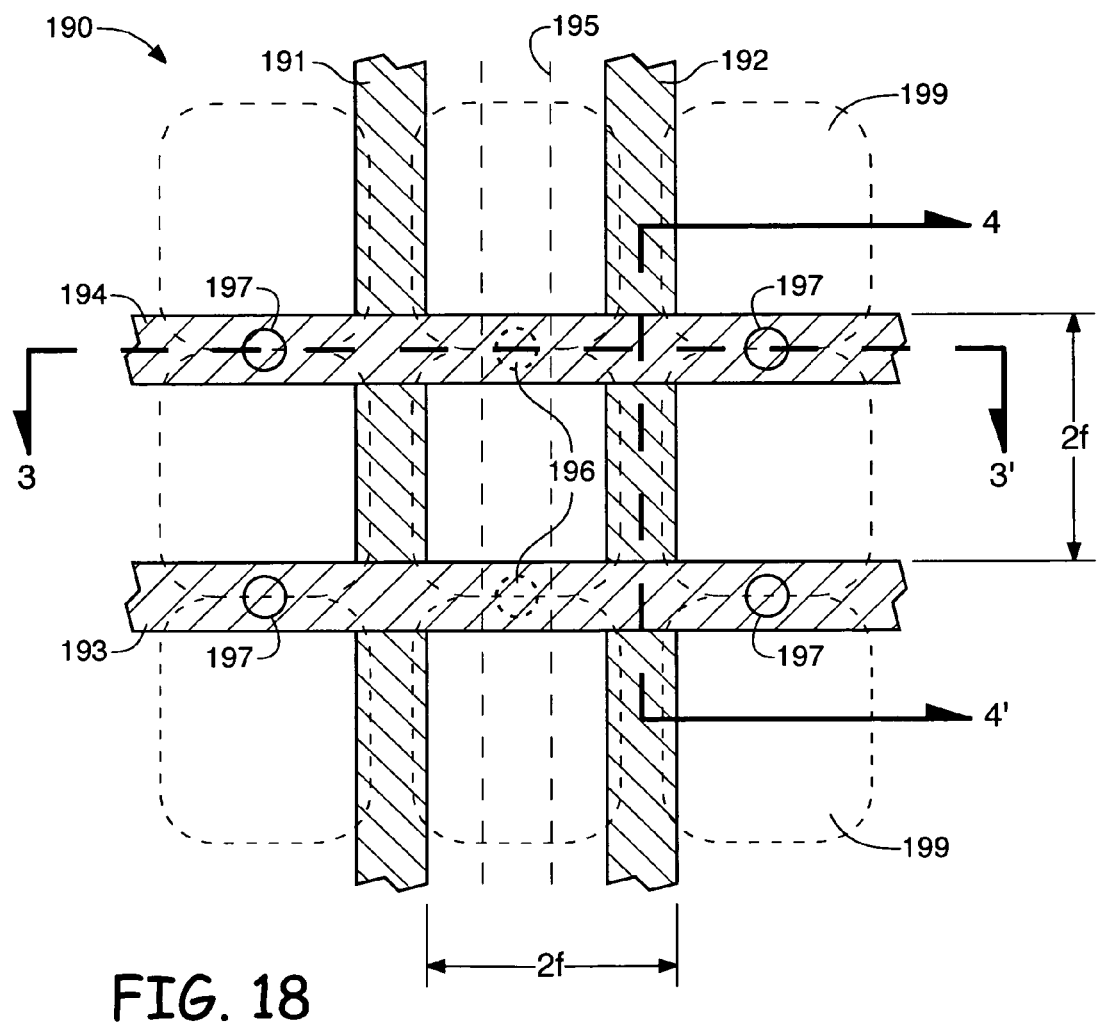
FIG. 18 is an overhead view of a memory array section scaled to a $4f^2$ memory cell size, utilizing an array of transistor surround gate structures in a third embodiment of the present invention.
Figure 19:
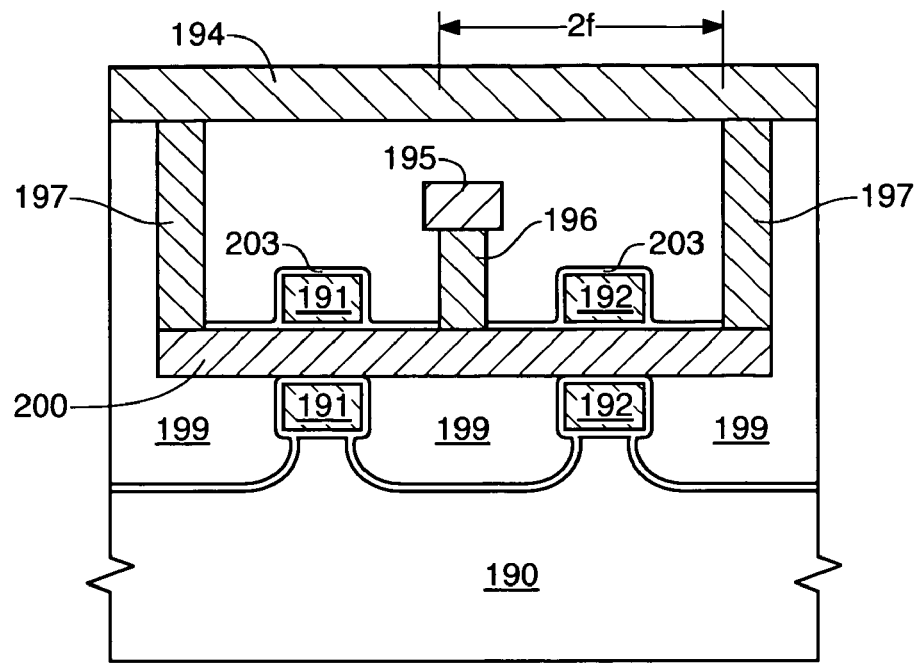
FIG. 19 is a cross-sectional view taken in the x-direction through cross-section line 3-3' of FIG. 18.
Figure 20:
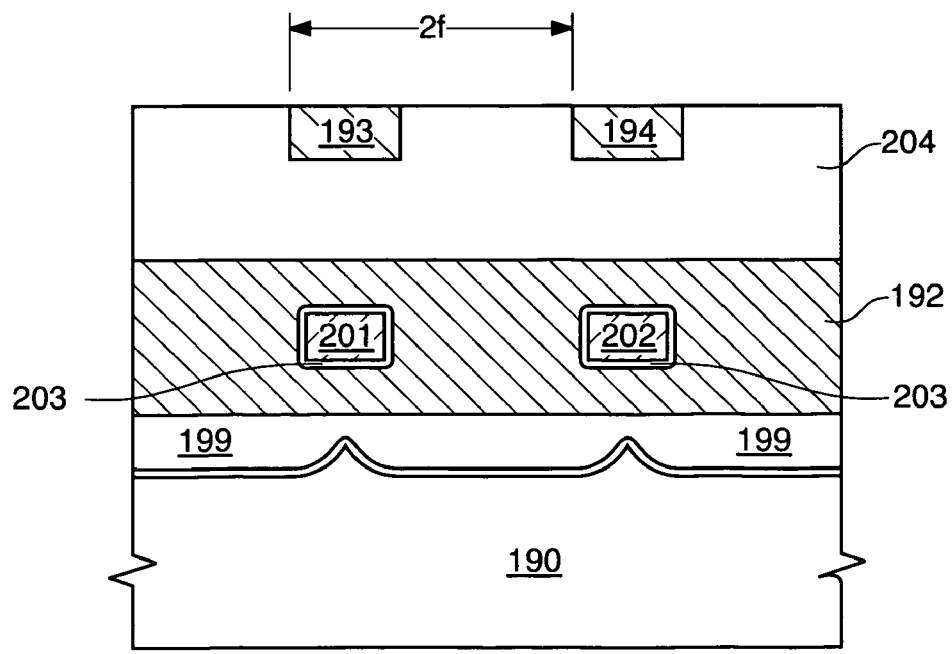
FIG. 20 is a cross-sectional view taken in the y-direction through cross-section line 4-4' of FIG. 18.

FIG. 18-FIG. 20 show a third embodiment of the present invention that utilizes the concepts taught in FIG. 9-17. Referring now to the overhead view of FIG. 18, a memory array section 190 is scaled to a minimum lithographic feature size of $4f^2$ memory cell size, utilizing an array of transistor surround gate structures of the second embodiment of the present invention. The capacitance of the transistor surround gate channel structure will be relied upon to store a charge in lieu of a storage capacitor. The feature size "f" corresponds to the line width of a digit line, thus each cell in the array running along the x-direction has a 2f line width. When viewing the array in the y-direction the corresponding cell has a 2f line width as well. Thus, due to scalability of the transistor surround gate structure of the various embodiments of the present invention, the memory array may be designed to have a $4f^2$ cell size, which allows for desired scaling of the memory array.

Referring further to the overhead view of FIG. 19, depicted in memory array section 190 are a plurality of word lines (WL) from $W_1$ 191, to $WL_N$ 192, a plurality of digit lines (DL) from $DL_1$ 193, $DL_N$ 194, a corresponding common source (CS) lime 195 and common source contacts $CS_C$ 196, a plurality of drain contacts $DC_1$ 197-$DC_N$ 198 and a plurality of isolation oxide regions 199. The overhead view of FIG. 18 depicts a portion of a memory array that may be utilized in a non-volatile storage device, such as a flash memory device.

FIG. 19 is a cross-sectional view taken through cross-section line 3-3' of FIG. 18. Referring now to FIG. 19, a semiconductor substrate 190 is prepared to accept a plurality of transistor surround gate devices as fabricated using the steps taught in FIG. 9-FIG. 17 of the second embodiment of the present invention. The cross-sectional view of FIG. 19 shows a plurality of WL 191 and 192 separated by isolation oxide 199. In this cross-section, the transistor devices comprise channel regions 200 and 201, respectively. Each channel region is coated with transistor gate oxide region 203 and is encompassed by transistor surround gates (or word lines) 191 and 192, respectively. In the embodiment depicted in overhead view FIG. 18, the source of each transistor is connected by common source contact $CS_C$ 196, to form a common source 195 to each corresponding transistor device. The drain electrodes of channel regions 200 and 201 are connected to drain contacts $DC_1$ 197 and $DC_N$ 198, respectively. Oxide 204 isolates word lines 191 and 192 and $CS_C$ 196 from overlying digit line 194. Each transistor surround gate may be topped with a polycide material (not shown) if desired.

FIG. 20 is a cross-sectional view taken through cross-section line 4-4' of FIG. 18. Referring now to FIG. 20, a semiconductor substrate 190 is prepared to accept a plurality of transistor surround gate devices as fabricated using the steps taught in FIG. 9-FIG. 17 of the second embodiment of the present invention. The cross-sectional view of FIG. 20 shows $WL_N$ 192 separated from silicon substrate 190 by isolation oxide 199. Transistor devices comprise a corresponding channel region 201 and 202, respectively. Each channel region is coated with transistor gate oxide region 203 and is encompassed by transistor surround gates (or word line) 192. An oxide 204 is used to isolate word line 192 from a pair of overlying digit lines, DL1 193 and DLN 194. Each transistor surround gate may be topped with a polycide material (not shown) if desired.

Though the embodiment as depicted in FIG. 18-FIG. 20 shows an array of transistor surround gate structures having the sources connected to form a common source array, the embodiment is not meant to limit the layout or arrangement of the transistor surround gate structures as each transistor surround gate structure may have a separate source to allow for individual programming of each transistor or the array may have various segments of transistor surround gate structures with each segment having a common source.

Figure 21:
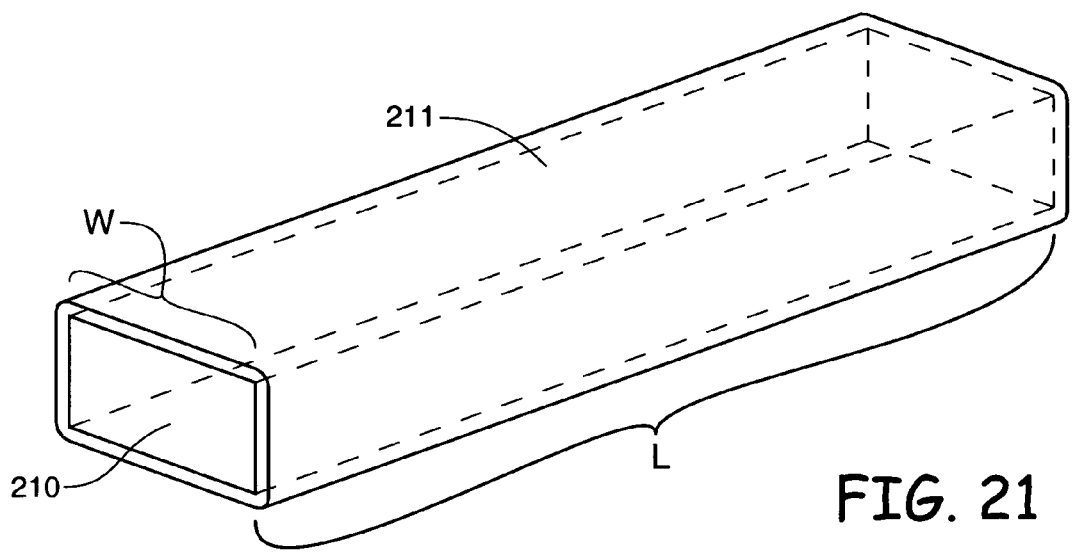
FIG. 21 is a three dimensional view of the transistor channel structure depicting the dimensions of the channel components that may be used to design the desired size of the transistor channel structure.

FIG. 21 depicts a three dimensional view of a channel region of the transistor surround gate structure of the various embodiments of the present invention depicting the channel dimensions necessary to design the desired size of the surround transistor gate structure. Referring now to FIG. 21, silicon bridge 210 and now considered transistor channel region 210 is encompassed by gate oxidation 211. The surface area of transistor channel region 210 is determined by the length (L) of the channel multiplied by the width (W) of the channel. Because the channel region is rectangular the resulting surface area becomes 4WL which results in the surface area being four times the surface area of a standard transistor channel. If W=f; where f=LW (line width) then the transistor surround gate structure is scalable to $4f^2$. As mentioned previously, the channel of the surround transistor gate structure is relied upon to store a charge. The capacitance of the transistor surround gate structure compared to a standard transistor structure is determined by the equation $C_{source/gate} = 4C_{standard\ transistor}$, which demonstrates that the capacitance of a transistor surround gate structure sized to $4f^2$ will adequately store a charge required for memory storage of digital data.

Figure 22:
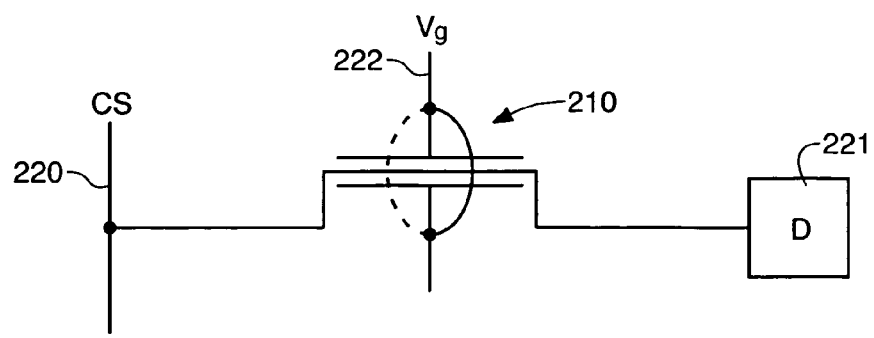
FIG. 22 is a schematical representation of the electrical transistor device in which embodiments of the invention may be included, having a transistor surround gate structure of each embodiment of the present invention.

As an example, FIG. 22 is a schematical representation of the electrical transistor device depicting a transistor surround gate device of the various embodiments of the present invention. FIG. 22 shows control source electrode 220 connecting to the transistor channel 210, which in turn connects to drain electrode 221. The surround gate electrode 222 encompasses transistor channel 210. The operation of transistor surround gate device is demonstrated in Table 14.0 with voltages applied to the gate ($V_g$), the drain ($V_D$) and the source ($V_S$) and the current leakage to the substrate ($LKG_{sub}$), to the drain ($LKG_D$) and the threshold ($V_T$).

TABLE 14.0

| | $V_g$ (volts) | $V_D$ (volts) | $V_{CS}$ (volts) | $LKG_{sub}$ (amperes) | $LKG_D$ (amperes) | $V_T$ (volts) |
|---|---|---|---|---|---|---|
| Write | −2.5 | 2.0 | Float | ~0 | *GIDL | NA |
| Hold | −2.5 | Float | Float | ~0 | ~0 | NA |
| Read/ Erase | 2.0 | 0.1 | 0 | NA | ON | ON |

*GIDC = Gate Induced Drain Leakage (due to tunneling)

Table 14.0 shows for example, that to transfer a charge to the channel of the transistor surround gate device of the various embodiments of the present invention, the Write operation is exercised by applying a $V_g$ potential of −2.5V to the gate electrode, a $V_D$ potential of 2.0V to the drain electrode such that the net potential difference between gate and the drain is around 4.5V thereby causing band-bending induced tunneling current (GIDL—gate induced drain leakage). The programmed states of a "1" or a "0" correspond to the threshold of the transistor due to the stored charge. The threshold voltage ($V_T$) of the transistor programmed to one of the states (0 or 1) would be low as channel inversion is greater due to a less positive charge in the channel interface, while the threshold voltage ($V_T$) of the transistor programmed to the other state (1 or) would be high due to the higher positive charge on the channel interface. Stored charge is lost during the Read/Erase operation. Operations for Hold and Read/Erase operations may be observed in a similar fashion from the values listed in Table 14.0. Other biasing schemes are possible with this structure.

Various embodiments of the present invention have been discussed in reference to forming a transistor structure for use in semiconductor assemblies, such as memory devices (e.g. dynamic random access memory, embedded memory, flash memory, etc.). However, the concepts taught in the various embodiments of the present invention may be utilized by one of ordinary skill in the art to form such transistor structures for use in most all semiconductor applications. For example, the embodiment of the present invention may be applied to a semiconductor system, such as the one depicted in FIG. 23, the general operation of which is known to one skilled in the art.

Figure 23:
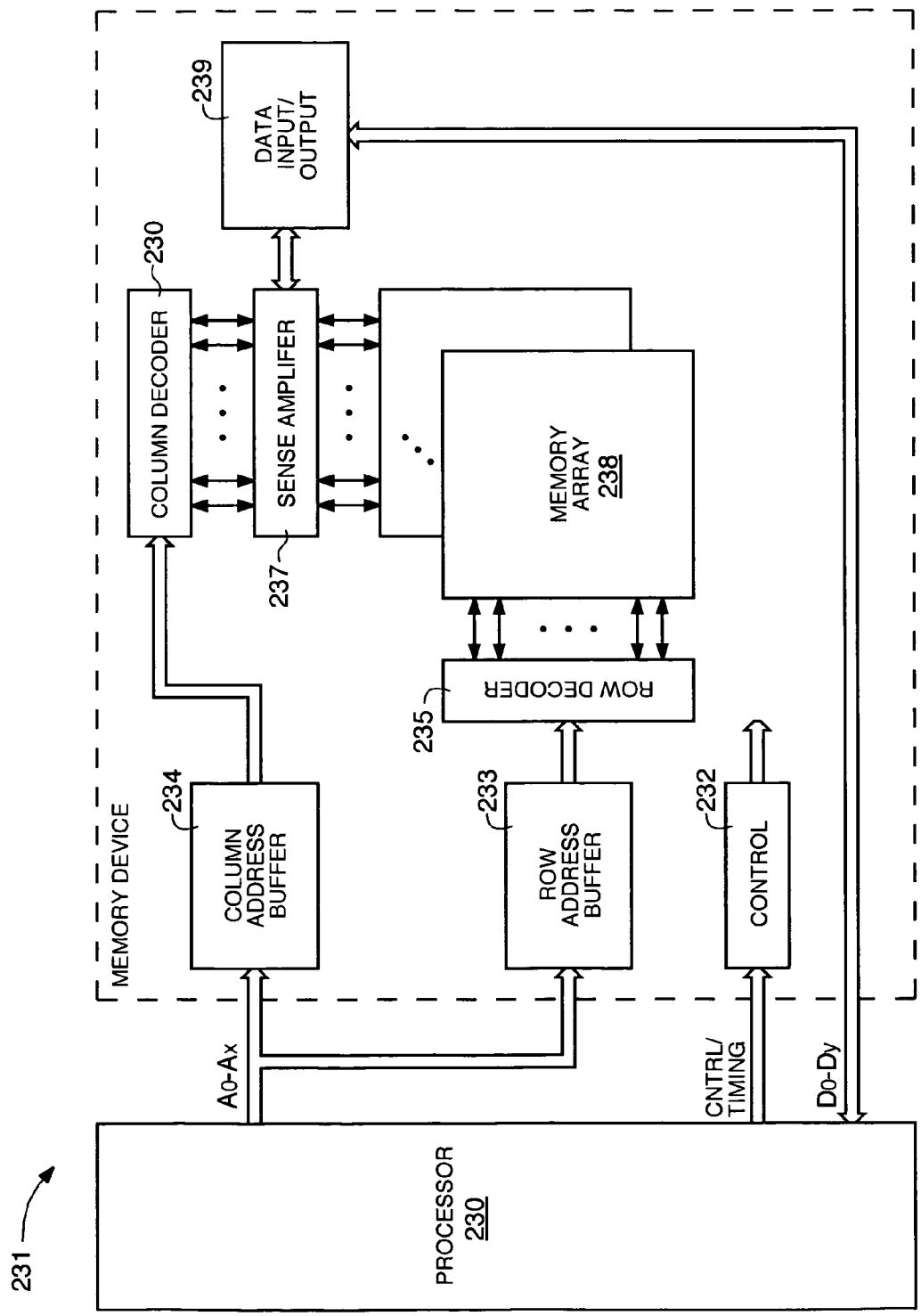
FIG. 23 is a simplified block diagram of a semiconductor system in which a memory device including any embodiments of the invention may be incorporated.

FIG. 23 represents a general block diagram of a system having a transistor embodiment of the invention, the system comprising a processor 230 and a memory device 231 showing the basic sections of a memory integrated circuit, such as row and column address buffers, 233 and 234, row and column decoders, 235 and 236, sense amplifiers 237, memory array 238 and data input/output 239, which are manipulated by control/timing signals from the processor through control 232.

The transistor surround gate structure of the invention, when utilized in an application as demonstrated in the various embodiments discussed herein, provides a simplified manufacturing process to fabricate a single transistor storage structure and allows for a storage structure to be scaled to a $4f^2$ design size.

It is to be understood that, although the various embodiments of the present invention have been described with reference to particular applications, various modifications, known to those skilled in the art, may be made to the disclosed structure and process herein without departing from the invention as recited in the several claims appended hereto.

What is claimed is:

1. A method of forming a transistor surround gate structure for a semiconductor memory device comprising:
    forming a silicon substrate having trench isolation regions therein;
    forming partial silicon-on-insulator regions spanning laterally between the trench isolation regions;
    forming full-silicon-on-isolator isolation regions running perpendicular to a the partial silicon-on-insulator regions;
    forming a transistor channel silicon bridge lying laterally between the trench isolation regions and above the partial silicon-on-insulator regions, the transistor channel silicon bridge running parallel to the partial silicon-on-insulator regions and perpendicular to the full-silicon-on-isolator isolation regions;
    forming a transistor gate oxide around the exposed regions of the transistor channel silicon bridge; and
    forming a polysilicon surround gate encompassing the transistor channel silicon bridge but separated therefrom by the transistor gate oxide.

2. The method of claim 1, wherein forming a transistor channel bridge further comprises:
    patterning a nitride hard mask to define an underlying active area bridge in the silicon substrate;
    etching a recess into the silicon substrate between the nitride hard mask and the trench isolation regions;
    forming substantially vertical nitride spacers along a silicon portion defining the transistor channel and along the trench isolation regions;
    isotropically etching exposed regions of the silicon portion selective to oxide to create a cavity around and beneath the transistor channel silicon bridge while leaving a majority of the transistor channel silicon bridge intact and the surface of the etched silicon substrate spanning between the silicon-on-insulator regions; and
    removing the nitride hard mask and nitride spacers.

3. The method of claim 2, wherein forming a polysilicon surround gate further comprises:
    depositing a polysilicon fill material into the cavity;
    planarizing the polysilicon fill material;
    depositing a photoresist to pattern a transistor surround gate structure; and
    patterning the transistor surround gate structure.

4. The method of claim 3, further comprising:
    forming a polycide material on the planarized polysilicon fill material.

5. The method of claim 2, wherein the isotropically etching stops so that the surface of the etched silicon substrate spanning between the partial silicon-on-insulator regions is recessed to no more than one-half the depth of the partial silicon-on-insulator regions.

\* \* \* \* \*

UNITED STATES PATENT AND TRADEMARK OFFICE
CERTIFICATE OF CORRECTION

| | | |
|---|---|---|
| PATENT NO. | : 7,445,973 B2 | Page 1 of 1 |
| APPLICATION NO. | : 11/541186 | |
| DATED | : November 4, 2008 | |
| INVENTOR(S) | : Gonzalez et al. | |

It is certified that error appears in the above-identified patent and that said Letters Patent is hereby corrected as shown below:

In column 10, line 2, in Claim 1, delete "a the" and insert -- the --, therefor.

Signed and Sealed this

Twenty-fourth Day of February, 2009

JOHN DOLL
*Acting Director of the United States Patent and Trademark Office*